United States Patent
Mei et al.

(10) Patent No.: US 10,847,384 B2
(45) Date of Patent: Nov. 24, 2020

(54) METHOD AND FIXTURE FOR CHIP ATTACHMENT TO PHYSICAL OBJECTS

(71) Applicant: Palo Alto Research Center Incorporated, Palo Alto, CA (US)

(72) Inventors: Ping Mei, San Jose, CA (US); Brent S. Krusor, Fremont, CA (US); Steven E Ready, Los Altos, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 24 days.

(21) Appl. No.: 15/609,108

(22) Filed: May 31, 2017

(65) Prior Publication Data
US 2018/0350729 A1 Dec. 6, 2018

(51) Int. Cl.
*H01L 21/02* (2006.01)
*H01L 21/56* (2006.01)
(Continued)

(52) U.S. Cl.
CPC ........ *H01L 21/565* (2013.01); *H01L 23/3114* (2013.01); *H01L 23/3121* (2013.01); *H01L 23/4985* (2013.01); *H01L 24/20* (2013.01); *H01L 24/24* (2013.01); *H01L 24/25* (2013.01); *H01L 24/82* (2013.01); *H01L 24/05* (2013.01); *H01L 24/76* (2013.01); *H01L 2224/02335* (2013.01); *H01L 2224/02379* (2013.01); *H01L 2224/05548* (2013.01);
(Continued)

(58) Field of Classification Search
None
See application file for complete search history.

(56) References Cited

U.S. PATENT DOCUMENTS

| 4,658,330 A | 4/1987 | Berg |
| 4,731,645 A | 3/1988 | Parmentier |

(Continued)

FOREIGN PATENT DOCUMENTS

| CN | 104517911 A | 4/2015 |
| DE | 10 2013 201 926 A1 | 8/2014 |
| EP | 2 639 278 A1 | 9/2013 |

OTHER PUBLICATIONS

EP Search Report dated Nov. 9, 2017—Application No. 16202082.0 (18 pgs).

(Continued)

*Primary Examiner* — Joseph C. Nicely
*Assistant Examiner* — Lamont B Koo
(74) *Attorney, Agent, or Firm* — Fay Sharpe LLP (57) ABSTRACT

Development of smart objects with electronic functions requires integration of printed components with IC chips or dies. Conventional chip or die bonding including wire bonding, flip chip bonding, and soldering may not be applicable to chip or die attachment on low temperature plastic surfaces used in physical objects. Printing conductive connection traces requires a smooth interface between contact pads of a chip and the surface of the physical object. In order to address this issue of chip/die attachment to a physical object, this disclosure provides embodiments to construct a fixture on a chip or die for attachment and electrical connection onto a physical object by printing operations and/or ACF bonding methods.

19 Claims, 8 Drawing Sheets

(51) Int. Cl.
*H01L 23/31* (2006.01)
*H01L 23/00* (2006.01)
*H01L 23/498* (2006.01)

(52) U.S. Cl.
CPC .............. *H01L 2224/2201* (2013.01); *H01L 2224/221* (2013.01); *H01L 2224/24105* (2013.01); *H01L 2224/24195* (2013.01); *H01L 2224/24226* (2013.01); *H01L 2224/24998* (2013.01); *H01L 2224/25171* (2013.01); *H01L 2224/2919* (2013.01); *H01L 2224/32225* (2013.01); *H01L 2224/73267* (2013.01); *H01L 2224/82007* (2013.01); *H01L 2224/8284* (2013.01); *H01L 2224/82102* (2013.01); *H01L 2224/83192* (2013.01); *H01L 2224/83851* (2013.01); *H01L 2224/83855* (2013.01); *H01L 2224/92244* (2013.01); *H01L 2924/171* (2013.01); *H01L 2924/18162* (2013.01)

(56) References Cited

U.S. PATENT DOCUMENTS

| | | | |
|---|---|---|---|
| 5,976,912 | A | 11/1999 | Fukutomi |
| 5,986,334 | A * | 11/1999 | Lee .................. H01L 23/13 257/667 |
| 6,815,251 | B1 | 11/2004 | Akram |
| 2002/0153832 | A1 | 10/2002 | Yanagisawa et al. |
| 2003/0013235 | A1* | 1/2003 | Featherby .......... H01L 23/293 438/127 |
| 2004/0155322 | A1* | 8/2004 | Cho .................. H01L 23/3128 257/676 |
| 2006/0258044 | A1 | 11/2006 | Meyer et al. |
| 2007/0183273 | A1 | 8/2007 | Arai |
| 2008/0179725 | A1* | 7/2008 | Chia .................. H01L 23/13 257/676 |
| 2009/0056997 | A1 | 3/2009 | Fjelstad |
| 2010/0013076 | A1 | 1/2010 | Jang et al. |
| 2012/0008287 | A1 | 1/2012 | Kim et al. |
| 2012/0049388 | A1 | 3/2012 | Pagaila |
| 2012/0268899 | A1 | 10/2012 | Haba et al. |
| 2012/0326271 | A1 | 12/2012 | Teh |
| 2013/0036829 | A1 | 2/2013 | Van Steenberge |
| 2013/0056867 | A1 | 3/2013 | Pagaila et al. |
| 2014/0291001 | A1 | 10/2014 | Lin |
| 2015/0162218 | A1 | 6/2015 | Cheung |
| 2015/0228508 | A1 | 8/2015 | Whiting et al. |
| 2015/0249043 | A1* | 9/2015 | Elian .................. B29C 64/106 257/684 |
| 2015/0282321 | A1* | 10/2015 | Aleksov ............. H05K 1/0284 174/254 |
| 2017/0048986 | A1 | 2/2017 | Mei |
| 2017/0171958 | A1 | 6/2017 | Ng et al. |

OTHER PUBLICATIONS

Fjelstad, "Solderless Assembly of Electronic Products—a More Reliable and More Cost Effective Approach to Electronics Manufacturing?", Vehicle Power and Propulsion Conference, 2009. VPPC '09., IEEE, 7 pgs.

Xie et al., "Heterogeneous Integration of Bio-Sensing System-on-Chip and Printed Electronics", IEEE Journal on Emerging and Selected Topics in Circuits and Systems (JETCAS), vol. 2, No. 4, pp. 672,682, Dec. 2012.

U.S. Appl. No. 14/965;039, filed Dec. 10, 2015 of Tse Nga Ng, et al. Entitled "Bare Die Integration With Printed Components on Flexible Substrate Without Laser Cut".

* cited by examiner

METHOD AND FIXTURE FOR CHIP ATTACHMENT TO PHYSICAL OBJECTS

INCORPORATION BY REFERENCE

US Patent Applications, U.S. Ser. No. 14/964,964 filed Dec. 10, 2015 (US Publication 2017-0048986-A1; published Feb. 16, 2017) and U.S. Ser. No. 14/965,039 filed Dec. 10, 2015, are hereby incorporated by reference in their entirety.

BACKGROUND

The present application is directed to electronic circuits, and more particularly to methods for constructing fixtures or structures for attachment of IC chips or dies for implementation with physical objects having electronic functions and/or flexible electronic systems.

Advanced physical objects and/or flexible electronic systems typically require a variety of discrete components such as microprocessors and/or other electronic components. These discrete components are traditionally connected to a circuit using processes such as reflow soldering. However, reflowing solder on a physical object or electronic system, which may include a flexible substrate that cannot withstand a high temperature need to re-flow solder, etc., may be unworkable. Therefore it is considered useful to provide methods and structures to improve the ability to connect IC chips and dies to physical objects or electrical systems.

BRIEF DESCRIPTION

An electronic package fixture comprises, a first surface having electrical traces and contact pads operationally located thereon as part of an existing electronic package; a second surface distanced from the first surface and positioned substantially parallel to the first surface, and having a surface area greater than a surface area of the first surface; a first sidewall extending between the first surface and the second surface, wherein the first sidewall is sloped at an angle in a range of between 10 degrees and 80 degrees; a second sidewall extending between the first surface and the second surface, wherein the second sidewall is sloped at an angle in a range of between 10 degrees and 80 degrees; a third sidewall extending between the first surface and the second surface, wherein the third sidewall is sloped at an angle in a range of between 10 degrees and 80 degrees; and a fourth sidewall extending between the first surface and the second surface, wherein the fourth sidewall is sloped at an angle in a range of between 10 degrees and 80 degrees, wherein the first sidewall and the second sidewall are opposed to each other and the third sidewall and the fourth sidewall are opposed to each other.

The existing electronic package being at least one of an packaged IC chip or unpackaged die.

The existing electronic package being incorporated into an electronic package holding structure which is defined by the first surface, the second surface, the first sidewall, the second sidewall, the third sidewall, and the fourth sidewall.

The electronic package holding structure incorporating the electronic package.

The first surface, the second surface, the first sidewall, the second sidewall, the third sidewall, and the fourth sidewall are a single component.

The slope angle of the first sidewall extending from the first surface to the second surface and the angle of the second sidewall extending from the first surface to the second surface have the same angle.

The angle of the first sidewall and the second side wall are each between 40 degrees to 50 degrees.

The sidewalls are one of straight and curved.

A method for constructing an electronic package fixture comprises, providing a mold having, (i) a first surface defined by an open area, (ii) a second surface distanced from the first surface and positioned parallel to the first surface, an area of the first surface being greater than an area of the second surface, (iii) a first sidewall extending between the first surface and the second surface, wherein the first sidewall is sloped at an angle in a range of between 10 degrees and 80 degrees; (iv) a second sidewall extending between the first surface and the second surface, wherein the second sidewall is sloped at an angle in a range of between 10 degrees and 80 degrees; (v) a third sidewall extending between the first surface and the second surface, wherein the third sidewall is sloped at an angle in a range of between 10 degrees and 80 degrees; (vi) a fourth sidewall extending between the first surface and the second surface, wherein the fourth sidewall is sloped at an angle in a range of between 10 degrees and 80 degrees, wherein the first sidewall and the second sidewall are opposed to each other and the third sidewall and the fourth sidewall are opposed to each other, wherein the mold defines a cavity area; positioning an existing electronic package having contact pads into the mold at the cavity area, the existing electronic package positioned with the contact pads placed in contact with the second surface of the mold; providing a structure forming material into the cavity area of the mold sufficient to incorporate the electronic package, wherein the providing includes filling the cavity area of the mold so as to have a substantially flat upper portion, and wherein the structure forming material is cured; and removing the solidified form as an electronic package carrying structure, which carries the electronic package, wherein the first surface with the conductive traces and contact pads are exposed for attachment with external elements.

The slope of the angles of the sidewalls are formed to permit printing of conductive traces onto the surfaces of the sidewalls to connect the electronic package to a physical object.

The mold is constructed of a Polydimethylsiloxane (PDMS) material.

The structure forming material is one of an epoxy, and UV curable polymer.

A method for constructing an electronic package fixture comprises, generating data representing an electronic image of an electronic package and electronic package holding structure including, (i) a first surface having a plurality of at least some of electrical components, conductive traces and contact pads operationally part thereof and located of a surface thereof, (ii) a second surface distanced from the first surface and aligned or positioned parallel to the first surface, and having a surface area greater than a surface area of the first surface, (iii) a first sidewall extending between the first surface and the second surface, wherein the first sidewall is sloped at an angle in a range of between 10 degrees and 80 degrees, (iv) a second sidewall extending between the first surface and the second surface, wherein the first sidewall is sloped at an angle in a range of between 10 degrees and 80 degrees, (v) a third sidewall extending between the first surface and the second surface, wherein the first sidewall is sloped at an angle in a range of between 10 degrees and 80 degrees, (vi) a fourth sidewall extending between the first surface and the second surface, wherein the first sidewall is sloped at an angle in a range of between 10 degrees and 80 degrees, wherein the first sidewall and the second sidewall are opposed to each other and the third sidewall and the fourth sidewall are opposed to each other; providing the electronic image data to a three dimensional (3D) printing system; performing 3D printing operations by the 3D printing system corresponding to the electronic image data provided to the 3D printing system; and generating, by the 3D printing system a physical electronic package and electronic package holding structure corresponding to the electronic image data provided to the three dimensional printer.

The electronic package and electronic package holding structure are formed as a single component.

The electronic package is at least one of an IC chip or die.

A bonding arrangement comprises, an IC chip or die, including a surface carrying conductive traces and contact pads
a thin film substrate provided with an opening which holds the electronic chip or die, wherein the surface of the IC chip or die and a surface of the thin film substrate are substantially planar to each other; a plurality of contact pads located on the surface of the thin film substrate and corresponding conductive traces extending from the contact pads of the IC chip or die corresponding to ones of the contact pads on the surface of the thin film substrate, wherein the contact pads on the thin film substrate are positioned in a fanned out arrangement from the contact pads on the IC chip or die, wherein a surface area over which the contact pads on the thin film substrate extend over is an area greater than an area over which the contact pads of the IC chip or die extend; and a conductive tape on a surface of a physical object positioned to selectively engage the contact pads on the thin film substrate.

DETAILED DESCRIPTION

Development of smart objects with electronic functions require integration of printed components with IC chips and dies. Conventional IC chip and die bonding including wire bonding, flip chip bonding, and soldering may not be applicable to IC chip and die attachment on low temperature surfaces, such as but not limited to those formed on plastic substrates, and which are commonly used in physical objects. Printing conductive connection traces requires smooth interface between contact pads of an IC chip or die and the surface of a physical object.

Figure 1:
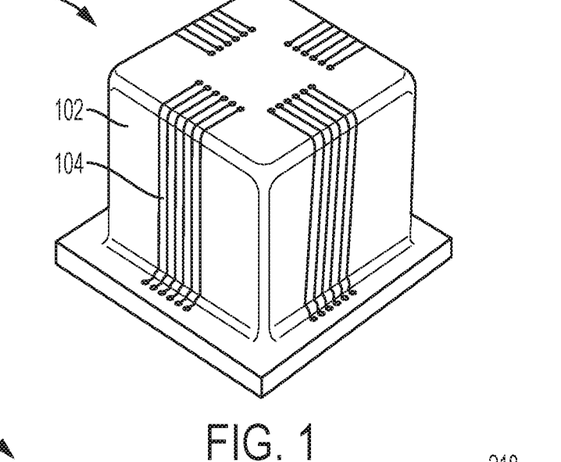
FIG. 1 illustrates a prior art example of conductive traces running through straight sidewalls at a 45 degree angles generated by use of aerosol printing.

FIG. 1 shows an example of an arrangement 100 having conductive traces 104 running through straight sidewalls 102 made by 45 degree angle aerosol printing. However, this angled printing is not convenient or practical in a typical printing environments.

Figure 2:
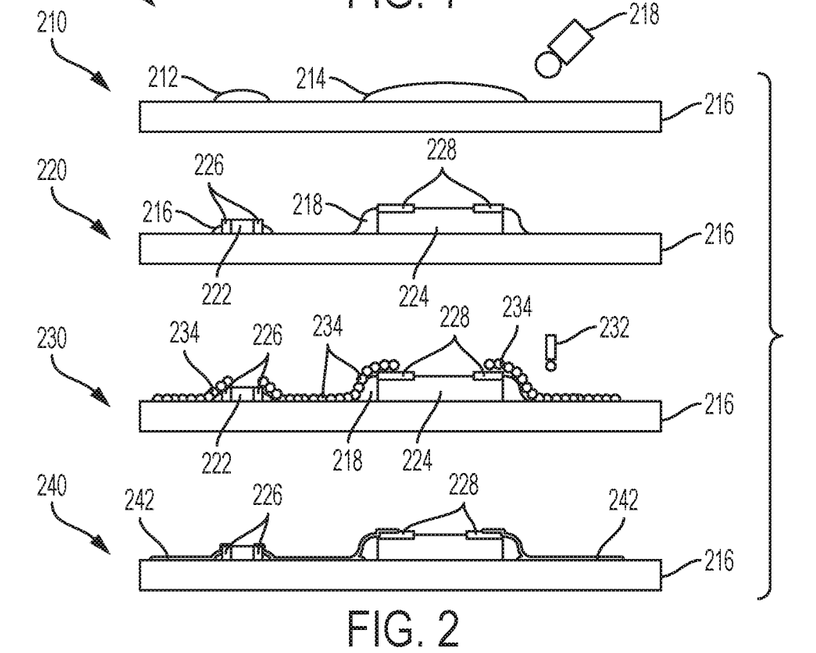
FIG. 2 shows a prior art assembly process which includes four steps.

Another arrangement to address the step height issue for printing on physical objects is to build a ramp around the edge of the IC chip or die. FIG. 2 shows a process 200 for such an arrangement, and includes: a first step 210 where non-conductive adhesive (NCA) 212, 214 is dispensed on a substrate 216, by a dispensing device 218; in a second step 220 components 222, 224 are placed within the NCA, with contacts 226, 228 upwards and thereafter the NCA 212, 214 is cured; in a third step 230 an inkjet printer 232, prints circuit patterns/interconnections 234; finally, in step 240 the arrangement is sintered 242. It is noted that in step 230 the non-conductive adhesive (NCA) is used to form a ramp to seal the sidewall of the IC chip or die and provide a supporting surface for printed conductive circuit patterns to connect the contact pads on the IC chip or die, to other parts of the circuit.

In order to provide a manufacturing process for unpackaged die integration on a flexible circuit methods and structures have been developed to facilitate high resolution connection with a printing process. Such processes are discussed in US patent applications, U.S. Ser. No. 14/964,964 filed Dec. 10, 2015 (US Publication 2017-0048986-A1; published Feb. 16, 2017) and U.S. Ser. No. 14/965,039 filed Dec. 10, 2015. The processes include making the surface of an IC chip or die substantially flush with a substrate. Around the sidewall of the IC chip or die, there is a filler to bridge the IC chip or die and the substrate. The top surface of the filler is also provided to be in line with the substrate surface.

Figure 3:
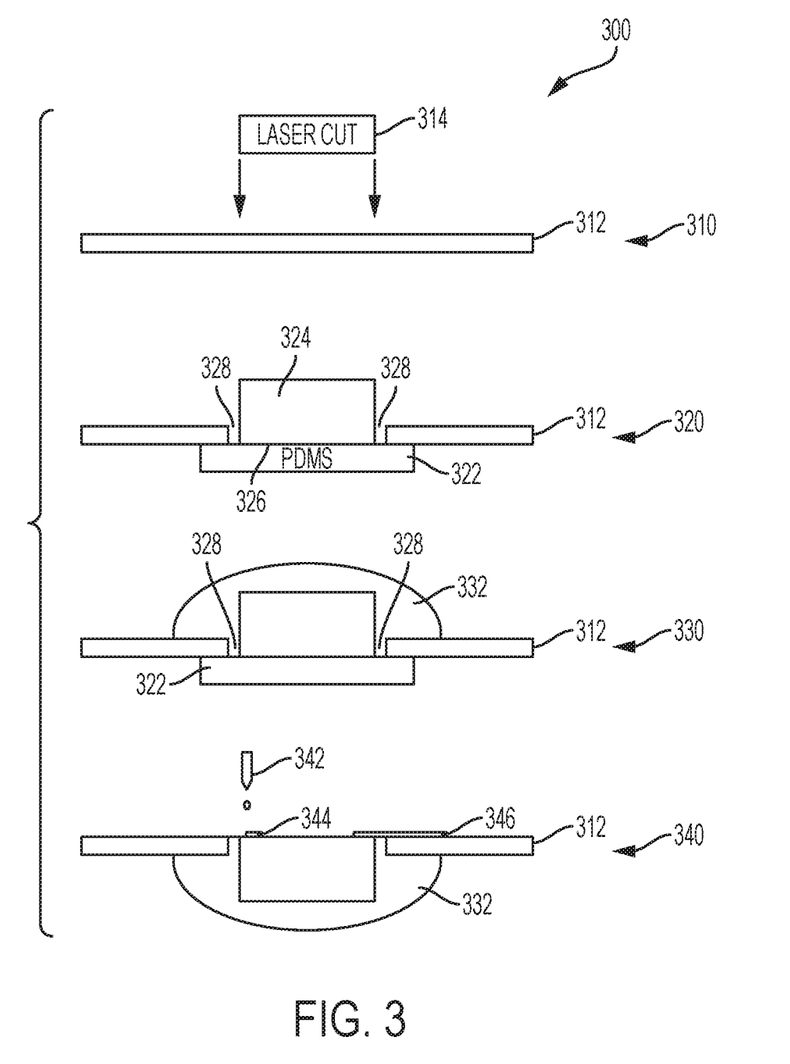
FIG. 3 depicts a processing steps of making chip attachments with a flush interface between chip contact pads and the surface of the substrate.

With further attention to the above, FIG. 3 illustrates a process 300 including steps 310-340 to construct such an arrangement as above. In step 310, starting with a plastic or other flexible substrate 312, a shape is cut through with dimensions appropriate to the pertinent IC chip or die, such as with a laser cutting device 314. In step 320, a flat article with a sticking surface (e.g., Polydimethylsiloxane (PDMS) pad) 322 is provided. The substrate surface with the opening is placed onto this sticking surface. The IC chip or die 324 with its front surface 326 facing down is then placed in the open area, where a gap 328 may exist. In step 330, a UV curable polymer 332 is dispensed onto the backside of the IC chip or die, sealing the gap 328 between the edge of the IC chip or die 324 and the edge of the opening on the substrate 312. After UV curing, the UV curable polymer provides a bonding structure for the assembly. In step 340, the PDMS pad 322 is removed, exposing a substantially flat surface. Then as shown in step 340, an inkjet printer 342 undertakes inkjet printing to form conductive traces connecting contact pads on the IC chip or die and the circuit 344, 346 on the flexible substrate 312. The concepts of FIG. 3 is directed to IC chip or die attachment on typical substrates with an adequate thickness. However, it may not be suitable for physical objects, using a flexible low temperature substrate as known in the art.

To further address the issue of IC chip and die attachment to a physical object, the following disclosure provides embodiments to construct an electronic package fixture, which includes an electronic package carrying structure which incorporates an IC chip or die for attachment and electrical connection onto a physical object by commercially available printing and/or Anisotropic Conductive Film (ACF) bonding processes.

Figure 4:
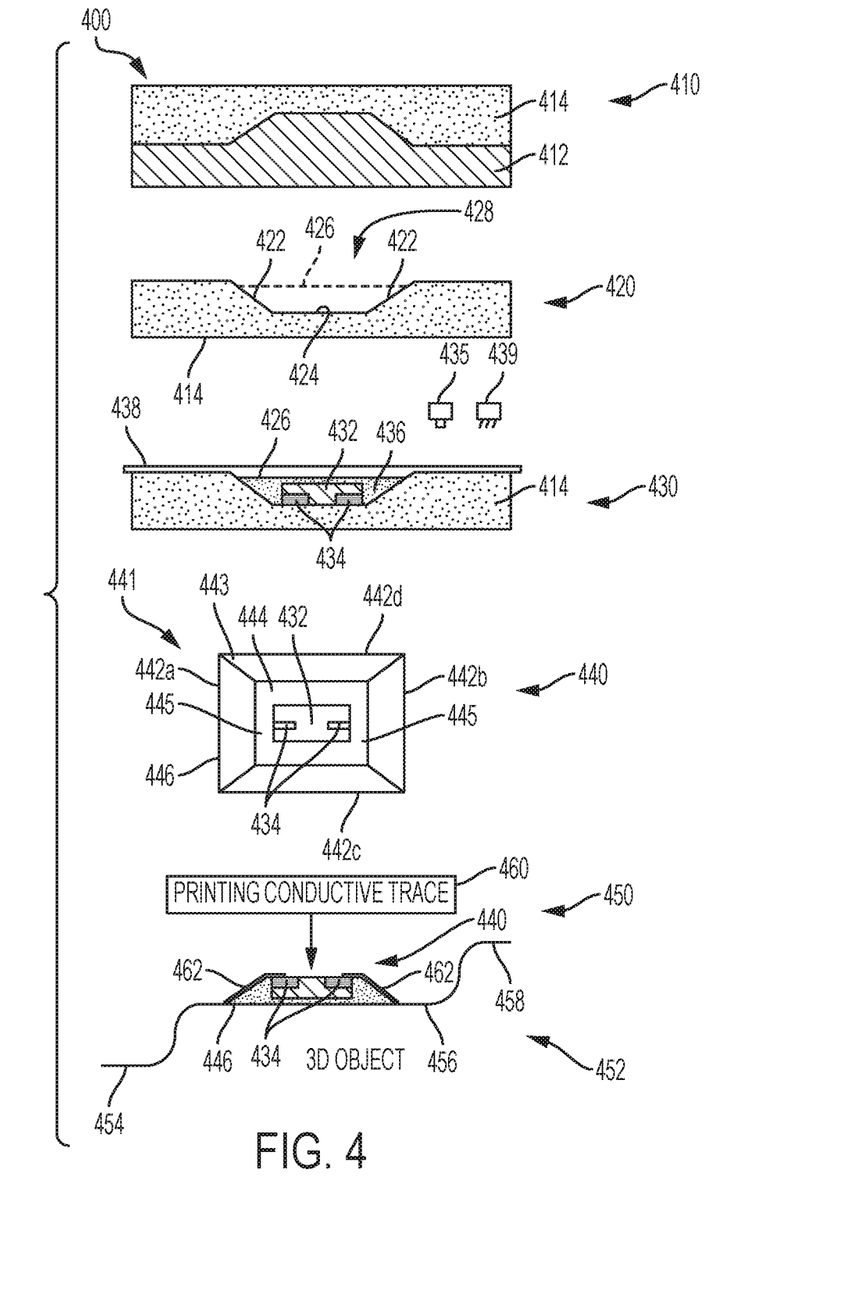
FIG. 4 illustrates a method and fixture arrangement for chip attachment to a physical object according to the present teachings.

Turning now to FIG. 4 illustrated is a process 400 for constructing an electronic package carrying structure which incorporates an existing electronic package, such as but not limited to being in the form of an IC chip or die. The electronic package carrying structure and the incorporated electronic package define an electronic package fixture. Further shown is the electronic package fixture attached to a physical object, where slopped sidewalls of the electronic package carrying structure allows printed conductive traces for connection of the IC chip or die to other circuitry of the physical object.

In FIG. 4, step 410 provides a master stamp 412, and a material dispensed in the form of a mold 414 which is a negative copy of the master stamp 412. In one embodiment mold 414 it is made of a tacky material (e.g., a PDMS material), although other materials may be used. A top surface of master 412 may be coated with Teflon to act as a release layer.

Figure 9A:
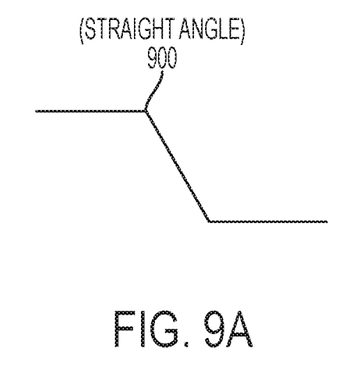
FIGS. 9A and 9B illustrate straight angled walls and curved angles walls.
Figure 9B:
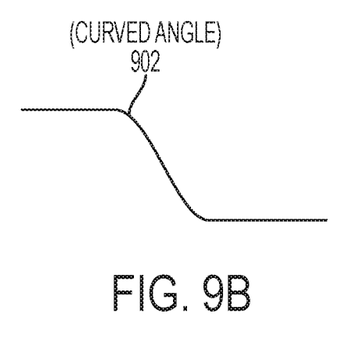

Turning to step 420, mold 414 is shown released from master stamp 412, turned over from the previous step. The mold 414 includes sloping sidewalls 422, a flat planar bottom area 424, and an upper opening 426 forming a cavity 428. The master stamp 412 of step 410 is designed whereby the resulting mold 414 includes the flat upper opening 426 large enough for an electronic package or component, such as an IC chip or die to be passed there though. The slope of the sidewalls 422 of the mold 414 can be in an angle of 10-80 degrees (and in other embodiments in an angle range of 40 to 50 degrees) and can be straight or curved. The purpose of this shape is to make a smooth connection between contact pads of the IC chip or die to the surface of a physical object. As shown in FIGS. 9A and 9B, in addition to a straight side wall, e.g., 900 of FIG. 9A, the sidewalls of such structures may also be formed with curved side walls 902 of various angles, e.g., 10 to 80 degrees, and in certain embodiments between 40 to 50 degrees.

Turning to step 430 of FIG. 4, an existing electronic device (e.g., such as IC chip or unpackaged die) 432, with contact pads 434 facing down is placed on the bottom surface (i.e., 424 of step 420) of mold 414. A dispensing device 435 provides a structure forming material (e.g., such as but not limited to a UV curable polymer, epoxy (including but not limited to flexible polymers, epoxies), etc.) 436 into cavity 428, until it at least covers a backside of the electronic package (i.e., IC chip or die) 432. Commonly the material is added so as to come up to or substantially up to upper opening area 426. The dispensed structure forming material 436 being substantially flat and/or level at this location. In certain embodiments a particular epoxy is selected which has a smaller thermal expansion relative to UV curable materials.

In one embodiment, to cure the structure forming material (e.g., epoxy), a flexible transparent substrate 438 is positioned over the filled cavity area 428, and a curing or fixing system or 439 operates to cure or otherwise fix the structure forming material 436. Thereafter substrate 438 is removed. It is understood other methods of fixing the structure forming material 436 may also be used.

In step 440 depicted is an electronic package fixture 441, which includes the cured electronic package carrying structure 443, which in turn incorporates the electronic package (e.g., IC chip or die) 432. The electronic package carrying structure 443, having been formed from the cured structure forming material 436.

The view of step 440 is flipped over such that contact pads 434 of IC chip or die 432 are facing upwards such that they are exposed to allow connections to be made thereto. Sloping or angled sidewalls 442a, 442b, 442c, and 442d conform to the angles of the sidewalls 422 of step 420. Therefore sidewalls 422a-422b are sloped or have angles of between 10-80 degrees (and in other embodiments in an angle range of 40 to 50 degrees) and can be straight or curved. Additionally, as surface 444 corresponds to the flat surface 424 of mold 414, surface 444 is substantially flat or planar. It is understood that surface 444 includes a surface of the electronic package 432 and surface portions 445 formed by the cured structure forming material 436. Additionally, numeral designation 446 is intended to represent a bottom surface of electronic package carrying structure 443, and corresponds to upper open area 426 of step 430.

Turning to step 450, physical object 452 has multiple levels, 454, 456, 458 (i.e., it is not an object having a fully planar surface, but is rather may be considered to be multi-dimensional). In this arrangement, the electronic package fixture of step 440 is placed such that its planar lower surface 446 is located on surface level 456 of physical object 452, with contact pads 434 being positioned to be accessible by a material printing device (e.g., such as but not limited to conductive material) 460. Material printing device 460 thereafter prints conductive traces 462 which connect to contact pads 434 and then further extend down the sloped sidewalls (i.e., 442a-442d) and thereafter make contact with additional components or conductive traces of the physical object 452. In step 450, the bottom surface of the electronic package fixture 441 of step 440 is fixed onto surface 456 by applying an amount of adhesive 464. This would be undertaken prior to the printing of the conductive traces 462 which as noted are, printed over the sidewalls 442a-442d to contact IC chip or die contact pads 434. Therefore, this alternately allows for a low temperature connection.

In FIG. 4, the master 412 in one embodiment is a trapezoidal shaped object made by 3D printing. In certain embodiments, the IC chip or die may include a plurality of contact pads with a pitch ranging 120 um to 1 mm which are placed on the bottom flat portion of the mold 414. In an embodiment the structure forming material 436 used to fill the mold cavity area 428 is a 5-minute epoxy. After being released from the mold 414, the surface of the IC chip or die 432 having the contacts 434 is seamlessly lined up with surface 444 including and is ready to be mounted and connected to a physical object (e.g., 452). The process 400 of FIG. 4 can be understood to be a retrofit process in the sense that a pre-existing IC chip or die can be used.

It is to be appreciated the foregoing details related to a particular embodiment, and the concepts of the present disclosure may take other forms to provide this ability to mount and connect such arrangements to the physical objects and such other embodiments are within the scope of the present teachings.

Figure 5A:
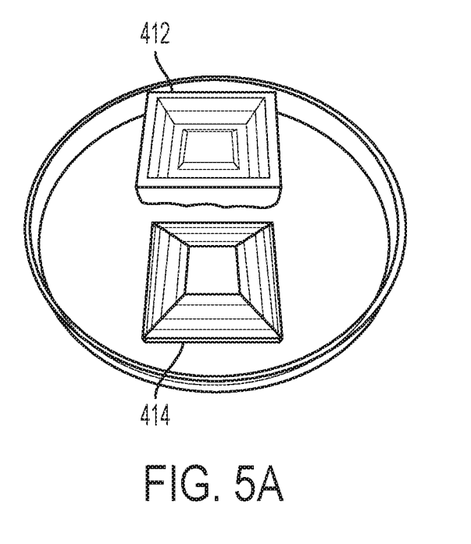
FIG. 5A illustrates a master mold in formed PDMS mold for an embodiment of the present application.
Figure 5B:
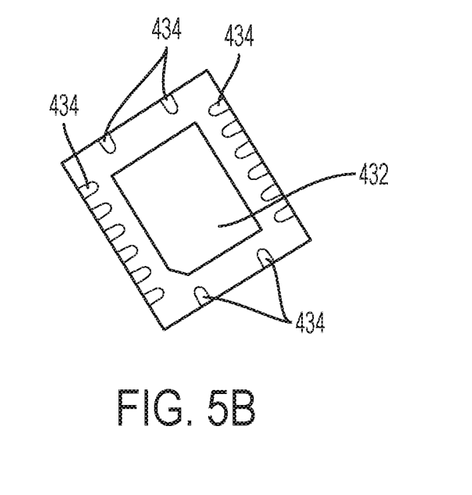
FIG. 5B depicts a chip which is incorporated into an arrangement of the present application.
Figure 5C:
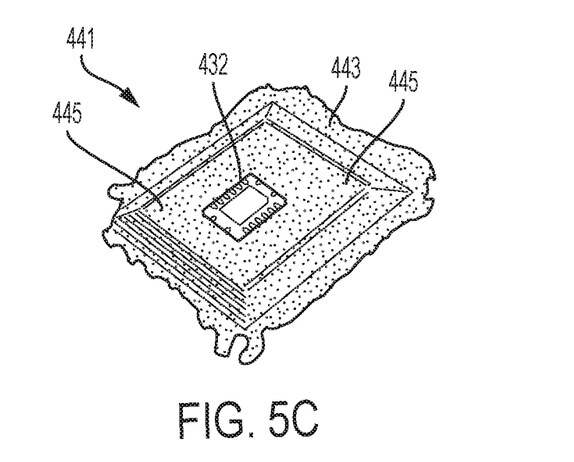
FIG. 5C depicts the chip of FIG. 5B configured within a mold obtained by use of the PDMS mold of FIG. 5A.

Turning to FIGS. 5A-5C, additional illustrations are provided of the concepts of FIG. 4 including a more detailed view of the master stamp 412 and mold 414 of FIG. 5A, the IC chip or die 432 depicted in this embodiment as having multiple (e.g., sixteen) contact pads 434, and in FIG. 5C, the electronic package fixture 441, wherein the IC chip or die 432 is embedded within the electronic package carrying structure 443 (including portions of the surface 445 which are not part of the electronic package 432) as shown in FIG. 5C.

Figure 6:
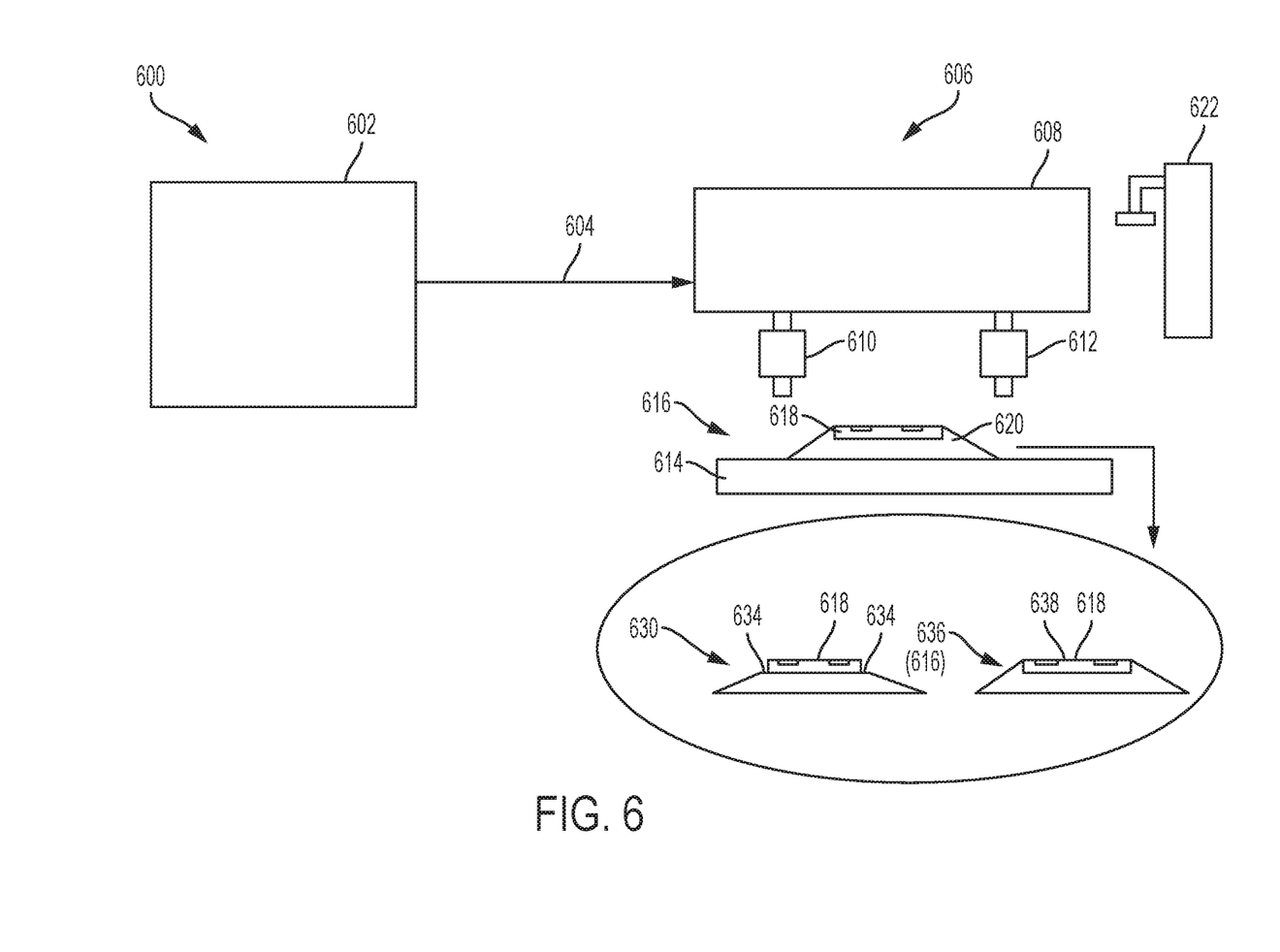
FIG. 6 depicts an embodiment of a system by which a fixture or structure according to an embodiment of the present application is formed.

Turning to FIG. 6, depicted is a system 600 implemented to perform processing of steps to print structures such as shown in FIG. 4. System 600 includes an electronic computing device 602, a communication line (e.g., wired or wireless connections) 604, a 3D printing device 606 (including a controller and material supply portion 608, along with print heads 610, 612), and a printing platform 614, on which is printed a structure (such as a electronic package fixture) 616, which is understood to include an electronic package (e.g., an IC chip or die) 618 and an electronic package holding structure 620 (e.g., formed by use of a structure forming material, such as but not limited to epoxy). In one embodiment the print heads 610, 612 are provided to illustrate the capability of 3D printing system 606 to print multiple distinct materials such that the 3D printing system 606 prints both the electronic package 618 and the electronic package holding structure 620.

In operation an electronic drawing (such CAD drawings) corresponding to what is to be printed by the 3D printing system is/are stored on the electronic computing device 602. This data is transferred to the 3D printing device 606, via the communication line 604, and is formatted to control operation of the 3D printing system 606. Wherein the electronic drawings reflect the item to be printed (e.g., the electronic package fixture 616).

In another embodiment the 3D printing system 606 is constructed such that a single or multiple print heads and an IC chip or die moving system (e.g., a pick and place system, etc.) 622 is provided. In this embodiment 3D printing system 606 prints a partially printed structure 630 up to a particular height (e.g., surface 632). Thereafter the IC chip or die moving system 622 positions an existing IC chip or die 632 onto surface 634 of the partially printed structure 630. Once the IC chip or die 622 is positioned, the 3D printing system 606 continues the printing operations until the fully printed structure 636 is even or planar with an upper surface 638 of the IC chip or die 632.

In certain embodiments to ensure the positioned IC chip or die 632 does not move during the continuing 3D printing, a layer of adhesive is provided to the planar surface 634 prior to providing the IC chip or die 632 to the upper surface 634. The layer of adhesive provided by operation of a print head of the 3D printing system 606, provided from the IC chip or die moving system 622, or by other known systems.

Figure 7A:
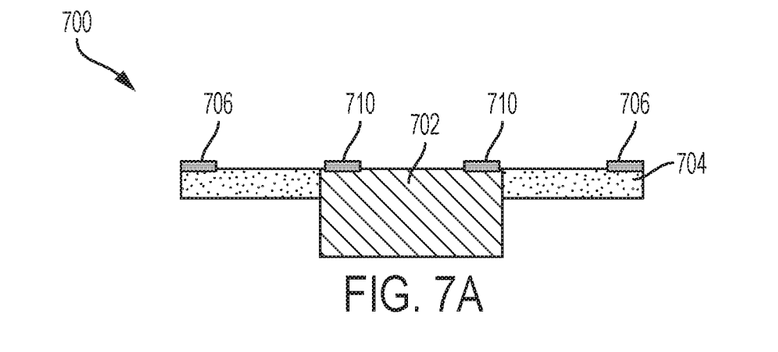
FIGS. 7A-7C illustrate steps for another embodiment of the present application.
Figure 7B:
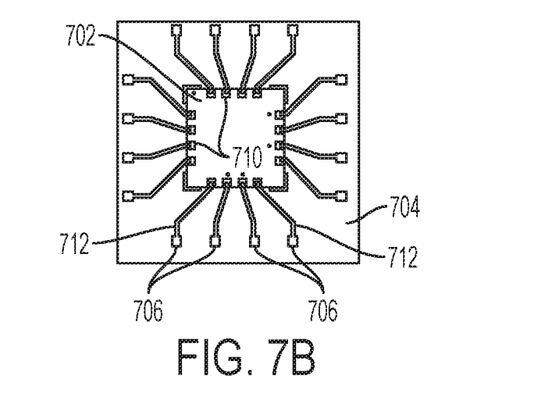
Figure 7C:
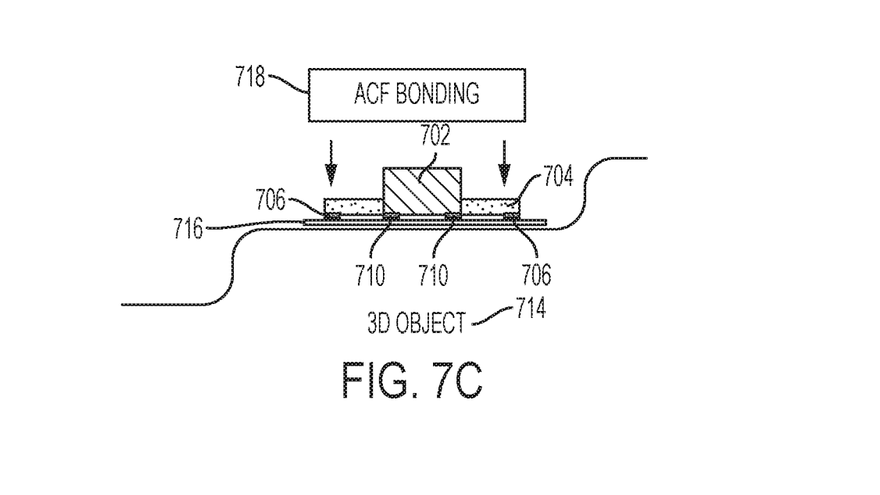

FIGS. 7A-7C and the associated discussion address another embodiment, where an IC chip or die with a thin film fixture is attached by ACF bonding. In this regard, the teachings of FIG. 3, teach that an IC chip or die can be attached to a plastic substrate through a hole in the thin substrate. Appreciating this teaching, FIG. 7A shows the teachings of an embodiment, where side view 700 depicts an IC chip 702 attached to a substrate 704 (i.e., such as but not limited to a plastic substrate) with fanned-out contact pads 706, 710 flushed with the top surface of the substrate 704, where the fanned-out contacts pads 704 extend out from contacts pads provided as part of the IC chip (i.e., see 710 of FIG. 7B).

Under the present teachings electric connections between the contact pads 710 of the IC chip 702 and the contact pads 706 on the substrate 704 can be established by printing conductive traces 712 there between (as shown in FIG. 7B). This fixture can be then used for chip attachment on a physical object, as discussed in connection with FIG. 7C.

Turning to FIG. 7B, in one embodiment the fixture (i.e., which includes 702, 704, 706) is located on a physical object 714, with an ACF material (e.g., Anisotropic conductive film) 716 having been placed between contact pads 706 and the physical object 714. A bonding device 718 contacts the fixture (e.g., from the backside of the contact pads 706) and applying heat and pressure to the contact area, which is between the contact pads 706 and the ACF layer 716. As it may be realized from the above discussion the thin film fixture (702, 704, 706) provides two particular functions for a successful bonding process: one is to allow for heat and pressure to be applied from the backside of the fixture since the thickness of the film is thin enough for heat conduction; another function is fan out the traces for proper size of the ACF contact area. It is noted FIGS. 7A-7C are not necessarily views of the exact same structures, but rather are provided to illustrate the described teaching.

Figure 8A:
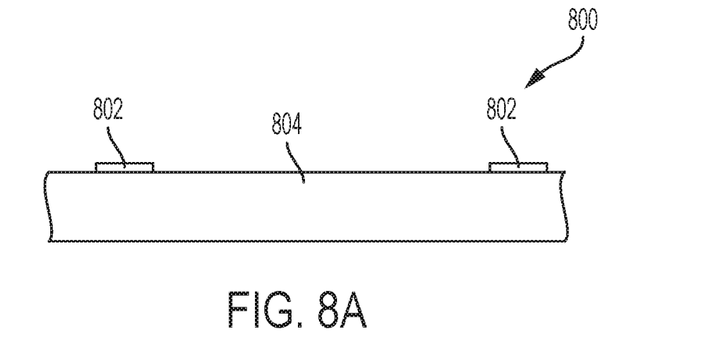
FIGS. 8A and 8B illustrate a substrate and an electronic circuit component which may be used in connection with the present teachings.
Figure 8B:
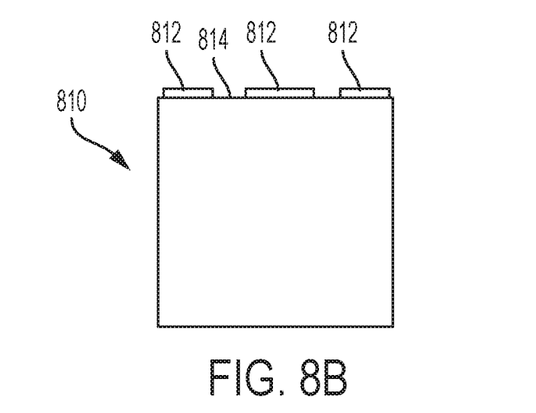

Turning now to FIGS. 8A and 8B, in the foregoing embodiments, the respective electronic circuitry is substantially level or planar with a surface of the respective substrates. However, it is to be understood the present concepts are also applicable when the electronic circuitry and substrates are not level. For example, in FIGS. 8A and 8B, illustrated is a substrate 800 and an electronic circuit component 810. As can be seen, the electronic circuitry or traces 802 on substrate 800, and electronic circuitry or traces 812 on electronic component 810, rise in profile above the respective surfaces 846, 814. In certain embodiments, the profiles are from substantially 1 to 20 microns, and more particular embodiments, are in the range of 10 to 20 microns above the respective surfaces (e.g., 804, 814). For example, when the electronic circuitry component 810 is placed in contact with a material (for example, PDMS) which is sufficiently soft, this allows elements 802 to push into the PDMS material providing an appropriate positioning arrangement for the remainder of the process to be undertaken.

Also, when a conductive trace is formed between substrate 800 and component 812, there is sufficient depositing height to generate a substantially flat conductive line such as shown in the preceding figures.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. An electronic package fixture comprising:
   a first surface having contact pads operationally located on the first surface as part of an existing electronic package and electrical traces extending from the contact pads;
   a second surface adjacent to the first surface and positioned substantially flush to the first surface, and having a surface area greater than a surface area of the first surface with the electrical traces of the first surface extending onto the second surface to contact pads on the second surface, and wherein the second surface is distinct from the first surface of the electronic package;
   a first sidewall, wherein the first sidewall is sloped at an angle in a range of between 10 degrees and 80 degrees;
   a second sidewall, wherein the second sidewall is sloped at an angle in a range of between 10 degrees and 80 degrees;

a third sidewall, wherein the third sidewall is sloped at an angle in a range of between 10 degrees and 80 degrees; and a fourth sidewall, wherein the fourth sidewall is sloped at an angle in a range of between 10 degrees and 80 degrees, wherein the first sidewall and the second sidewall are opposed to each other and the third sidewall and the fourth sidewall are opposed to each other, and wherein the first sidewall, the second sidewall, the third sidewall, and the fourth sidewall are positioned around the first surface and the second surface.

2. The electronic package fixture according to claim 1 wherein the existing electronic package is at least one of an IC chip or die.

3. The electronic package fixture according to claim 2 wherein the existing electronic package is incorporated into an electronic package holding structure which is defined by the second surface, the first sidewall, the second sidewall, the third sidewall, and the fourth sidewall.

4. The electronic package fixture according to claim 3 wherein the electronic package holding structure incorporates the electronic package.

5. The electronic package fixture according to claim 1 wherein the first surface, the second surface, the first sidewall, the second sidewall, the third sidewall, and the fourth sidewall are a single component.

6. The electronic package fixture according to claim 1 wherein the slope angle of the first sidewall extending from the first surface to the second surface and the angle of the second sidewall extending from the first surface to the second surface have the same angle.

7. The electronic package fixture according to claim 1 wherein the angle of the first sidewall and the second sidewall are each between 40 degrees to 50 degrees.

8. The electronic package fixture according to claim 1 wherein the sidewalls are one of straight and curved.

9. A method for constructing an electronic package fixture comprising:

providing a mold having, (i) a first surface defined by an open area, (ii) a second surface distanced from the first surface and positioned parallel to the first surface, an area of the first surface being greater than an area of the second surface, (iii) a first sidewall, wherein the first sidewall is sloped at an angle in a range of between 10 degrees and 80 degrees; (iv) a second sidewall, wherein the second sidewall is sloped at an angle in a range of between 10 degrees and 80 degrees; (v) a third sidewall, wherein the third sidewall is sloped at an angle in a range of between 10 degrees and 80 degrees; (vi) a fourth sidewall, wherein the fourth sidewall is sloped at an angle in a range of between 10 degrees and 80 degrees, wherein the first sidewall and the second sidewall are opposed to each other and the third sidewall and the fourth sidewall are opposed to each other, wherein the mold defines a cavity area, and wherein the first sidewall, the second sidewall, the third sidewall, and the fourth sidewall are positioned around the first surface and the second surface;

positioning an existing electronic package having contact pads into the mold at the cavity area, the existing electronic package positioned with the contact pads placed in contact with the second surface of the mold;

providing a structure forming material into the cavity area of the mold sufficient to incorporate the electronic package, wherein the providing includes filling the cavity area of the mold so as to have a substantially flat upper portion, and wherein the structure forming material is cured to a solidified form; and removing the solidified form from the mold as an electronic package carrying structure, which carries the electronic package, wherein the first surface with the contact pads is exposed for attachment with external elements.

10. The method according to claim 9 wherein the electronic package carrying structure includes sidewalls formed in conformance with the sidewalls of the mold, the slope of the angles of the sidewalls formed to permit printing of conductive traces onto the surfaces of the sidewalls to connect the electronic package to a physical object having the external elements.

11. The method according to claim 9 wherein the mold is constructed of a Polydimethylsiloxane (PDMS) material.

12. The method according to claim 9 wherein the structure forming material is one of an epoxy, and UV curable polymer.

13. The method according to claim 9 further including providing conductive traces connected to the contact pads of the first surface of the existing electronic package.

14. The method according to claim 9 wherein the external elements include at least contact pads distinct from the contact pads of the electronic package.

15. The method according to claim 9 wherein the solidified form of the electronic package carrying structure includes sidewalls corresponding to the sidewalls defined by the mold.

16. The method according to claim 9 further including connecting a surface of the electronic package fixture and a surface of a physical object, which includes the external elements.

17. The method according to claim 16 wherein the connecting is accomplished by a low temperature adhesive connection.

18. The method according to claim 16 wherein the connecting is accomplished by Anisotropic Conductive Film (ACF) bonding.

19. The method of claim 9 further including printing conductive traces which connect to the contact pads of first surface of the electronic package, which then further extend down the sidewalls of the electronic package carrying structure and thereafter make contact with additional components of a physical object having the external elements.

* * * * *